(12) United States Patent
Qian

(10) Patent No.: US 6,888,851 B1
(45) Date of Patent: May 3, 2005

(54) FRAME MATCHING METHOD

(75) Inventor: Feng Qian, Mission Viejo, CA (US)

(73) Assignee: VIA Telecom Co., Ltd., San Diego, CA (US)

( * ) Notice: Subject to any disclaimer, the term of this patent is extended or adjusted under 35 U.S.C. 154(b) by 840 days.

(21) Appl. No.: 09/686,786

(22) Filed: Oct. 11, 2000

Related U.S. Application Data
(60) Provisional application No. 60/209,490, filed on Jun. 7, 2000.

(51) Int. Cl.[7] .................................................. H04J 3/12
(52) U.S. Cl. ........................ 370/523; 370/252; 375/280
(58) Field of Search ................................. 370/523, 352, 370/389–395, 522, 252, 353, 342, 441, 328, 209; 348/223.1; 714/700, 755, 790, 774; 375/280, 265, 308, 332, 341, 225, 298, 340

(56) References Cited

U.S. PATENT DOCUMENTS

| | | | |
|---|---|---|---|
| 6,175,590 B1 * | 1/2001 | Stein | 375/225 |
| 6,356,601 B1 * | 3/2002 | Chen et al. | 375/340 |
| 6,370,669 B1 * | 4/2002 | Eroz et al. | 714/774 |
| 6,665,829 B2 * | 12/2003 | Eroz et al. | 714/755 |
| 6,675,347 B1 * | 1/2004 | Razoumov et al. | 714/790 |

OTHER PUBLICATIONS

Jinsoo Park, Samsung Electronics, "Puncturing for Flexible Data Rate", published Apr. 26, 2000, pp. 1–10.

* cited by examiner

*Primary Examiner*—Chi Pham
*Assistant Examiner*—Prenell Jones
(74) *Attorney, Agent, or Firm*—Martin J. Jaquez, Esq.; Jaquez & Associates

(57) ABSTRACT

The present invention pertains to a frame matching method for digital systems. Excess bits are deleted from a frame of data in a single iteration through the data, thereby creating a reduced length frame, wherein the deleting step is performed such that the distance between any two consecutive deleted bits within any group within first subset of the frame is A bits, and the distance between any two consecutive deleted bits within any group within a second subset of the frame is B bits, where A is an integer greater than 0 and B is an integer greater than A, and where the first subset and the second subset together form a plurality of consecutive bits.

18 Claims, 4 Drawing Sheets

FRAME MATCHING METHOD

CROSS REFERENCE AND PRIORITY CLAIM TO PROVISIONAL APPLICATION

This application claims the benefit of priority under 35 USC 119 to provisional application 60/209,490, filed Jun. 7, 2000 entitled "Frame Matching Method."

FIELD OF THE INVENTION

This invention relates to frame based digital communication systems and more particularly to a method for processing frames having a certain size in systems configured for frames having a different size.

DESCRIPTION OF THE RELATED ART

Digital data is often communicated in frames, which are groups of digital data that are processed together, as will be further described below. Often, it is desired to send for receive frames having a certain size in systems configured for different sized frames. For example, in the IS2000.2-A standard for code division multiple access (CDMA) communications, encoded symbols at a rate of L symbols per frame must be matched with a transmission scheme that processes N symbols per frame, where N is greater then L. In this case, for any one frame, the L symbols are repeated M times, where M is the smallest integer such that ML>N. Then, the ML symbols are reduced to N symbols by deleting (puncturing) P symbols, where P=ML−N. There is no appreciable loss of information on since in CDMA, many symbols are redundant to provide robust protection a against transmission errors; deleting a few redundant symbols will typically not cause any significant problems, especially if the symbols are far apart.

A system designer must decide which symbols to puncture. One conventional choice would be to simply puncture out every LM/P symbols. Since the symbols are discrete, in practice this means that the nearest integer lower than LM/P is punctured. For example, LM is 300 and P is 100 (i.e. 100 symbols must be deleted), every third symbol may be punctured. Using more realistic numbers for CDMA, LM maybe 2400 and P 864, so that every other symbol is punctured. However, if every other symbol is punctured starting at the beginning of the frame, there will be 672(= 2400−2*864) consecutive symbols at the end of the frame that aren't punctured et al. This non-uniformity in the puncturing scheme may result in performance degradation since, as mentioned above, it is desirable to keep the distance between deleted symbols as great as possible.

An alternate scheme involves puncturing out every D1th symbol, where D1 is the nearest integer greater than LM/P, thereby puncturing P1 symbols. In this case, if not enough symbols have been punctured (i.e. P1<P), a second iteration is performed to puncture P2 (=P−P1) symbols that are D1*[ P1/P2] symbols apart. (Here, the underline denotes the newest integer less than the amount in brackets.) Returning to the above example, in the first pass, every third symbol would be deleted, resulting in the deletion of 800 symbols. After this pass, 64 symbols still must be deleted, which is done by deleting every $36^{th}$ symbol. This second puncturing scheme is more uniform than the first scheme described above. However, this second puncturing scheme requires two iterations, which may be undesirable from an implementation standpoint. Further, this second scheme may result in two consecutive symbols being punctured, which could result in performance degradation. [Has this been publicly disclosed by Samsung? If not, we need its permission to discuss here.]

Therefore, it would be desirable to have a more uniform puncturing scheme than the first scheme without the complications and problems associated with the second scheme.

SUMMARY OF THE INVENTION

According to the present invention, excess bits are deleted from a frame of data in a single iteration through the data, thereby creating a reduced length frame, wherein the deleting step is performed such that the distance between any two consecutive deleted bits within any group within a first subset of the frame is A bits, and the distance between any two consecutive deleted bits within any group within a second subset of the frame is B bits, where A is an integer greater than 0 and B is an integer greater than A, and where the first subset and the second subset together form a plurality of consecutive bits.

BRIEF DESCRIPTION OF THE DRAWINGS

Other objects and advantages of the invention will become apparent upon reading the following detailed description and upon reference to the accompanying drawing in which.

Figure 1:
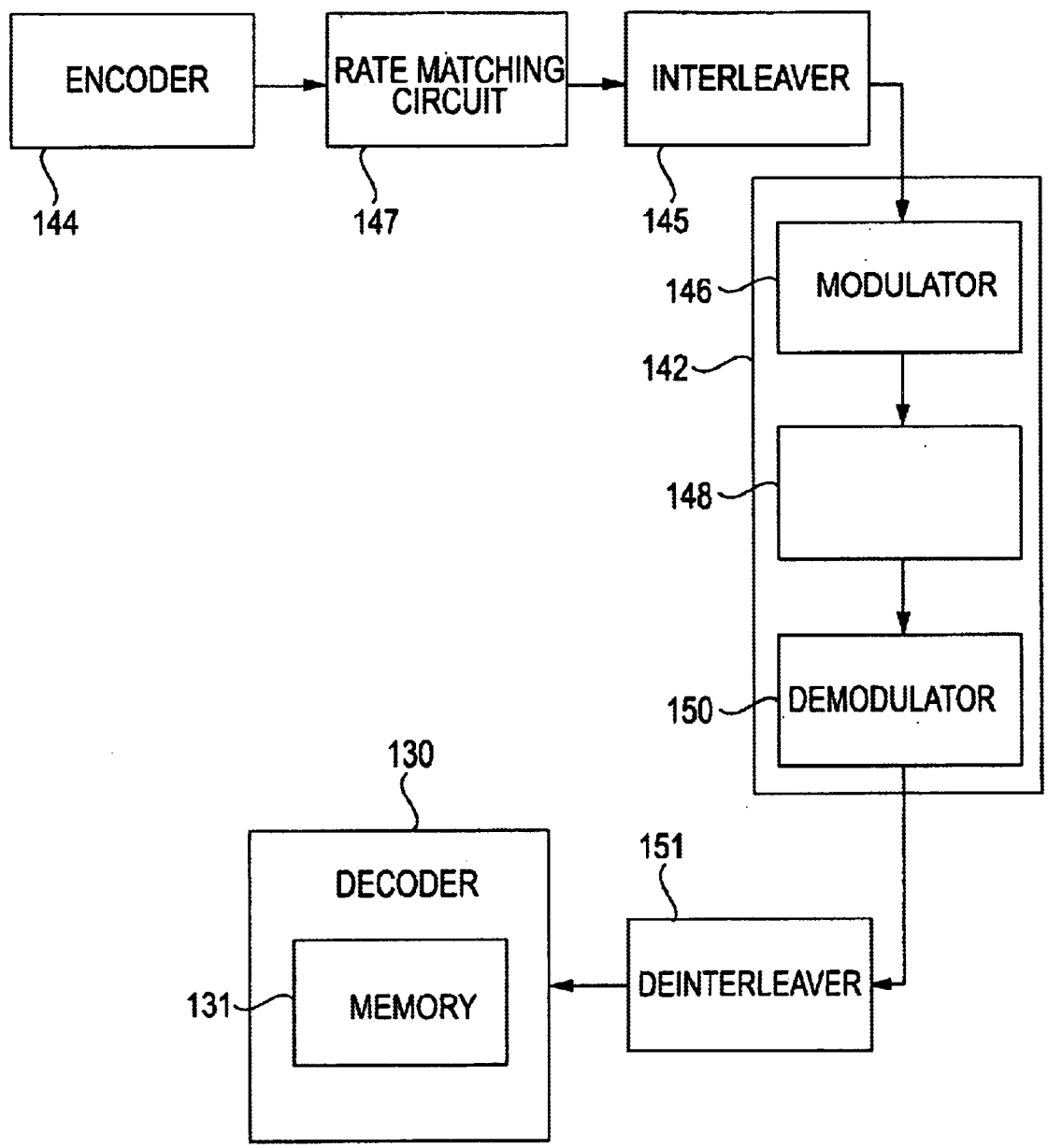
FIG. 1 is a block diagram of a possible digital communication system that includes a frame matching circuit the implements a frame matching method according to the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

This specification describes frame matching methods in the context of CDM A systems. However, it will be appreciated that the present invention is not restricted to CDMA systems.

As used herein, a "subset" of a frame consists of a least one group of consecutive five bits within a frame. For example, in a frame with bits ordered 1 through 10, a subset of the frame may consist of a group of the first two bits of the frame and a group of the last three bits of the frame. Another subset of that frame may consist of the third through seventh bits of the frame. If reference to more than one subset is made, such subsets are assumed not to overlap with one another. The length of a subset or group is the number of bits within the subset or group. A subset has a length of at least one (there are no "null" subsets).

The "distance" between two bits is the number of bits that separate those bits in an ordered frame. For example, in a frame with bits ordered 1 through 10, the distance between the first bit and the third bit is 1.

"Consecutive deleted bits" means a pair of deleted bits that are not separated by any other deleted bit.

FIG. 1 represents a digital communications system 140 within which the present invention may be embodied. As shown, the digital system 140 comprises a discrete-time channel 142 interposed between an encoder 144 and a decoder 130. Discrete-time channel 142 comprises a modulator 146, a channel 148 and a demodulator 150. An interleaver 145 is interposed between the encoder 144 and the modulator 146. A deinterleaver 151 is interposed between the decoder 130 and the demodulator 150. Channel 148 may be a transmission channel or a storage medium being written to and read from. Interleaver 145 receives a digital output signal from a rate matching circuit 147, which in turn receives a digital signal from an encoder 144. The interleaver 145 interleaves this digital output signal over a certain time period, which is usually predetermined and known as a frame. Modulator 146 serves to translate the digital output signal from interleaver 145 into signals suitable for channel 148 and thereafter drives the signals across channel 148.

Channel 148 may suffer from interference that corrupts said signals, the interference possibly taking form in any combination of additive noise, cross channel interference, multi-path interference, and channel fading. Demodulator 150 serves to receive the signals from channel 148 while minimizing the interference as much as is practical, and thereafter translate the signals into digital signals for input to deinterleaver 151, which deinterleaves the digital signal and provides it to decoder 130. Discrete-time channel 142 can thus be viewed as a unit accepting digital input signals and producing possibly corrupted digital output signals although the present invention is not limited to noisy channels.

Encoder 144 is a convolutional encoder which serves to add redundancy to input data signal 152. The output of the encoder 144 is L symbols per frame, which must be matched with the interleaver 145, which interleaves N symbols per frame, where N is greater than L. This matching is performed by the rate matching circuit 147, which repeats the L symbols of an input frame M times, where M is the smallest integer such that ML>N. Thereafter, the matching circuit 147 punctures P symbols from the repeated input frame, where P=ML−N.

According to the present invention, the matching circuit 147 deletes bits in a single iteration through a frame such that the distance that separates consecutive deleted bits is either A or B, where A is an integer greater than 0 and B is an integer greater than A. Preferably, A is equal to D−1, where D is the greatest integer less than LM/P where P=LM−N. In this case, B is preferably equal to A+1. For example, if N=1536 bits and L=1200 bits, then M equals 2, D is equal to 2, A is equal to 1 and B is equal to 2. Thus, either 1 or 2 bits separate deleted bits, which results in relatively uniform puncturing. The number of deleted bits $P_{D+1}$ separated by 3 is preferably equal to LM−PD and the number of deleted bits separated by A ($P_D$) is preferably equal to P−$P_{D+1}$. As will be described below, there are various implementations of the above described method.

More formally, according to the present invention, LM−N bits are deleted from a frame of data in a single iteration through the data, thereby creating a reduced length frame, wherein the deleting step is performed such that the distance between any two consecutive deleted bits within any group within a first subset of the frame is A bits, and the distance between any two consecutive deleted bits within any group within a second subset of the frame is B bits, where A is an integer greater than 0 and B is an integer greater than A, and where the first subset and the second subset together form a plurality of consecutive bits.

Preferably, an entire frame is punctured according to the preferred values of A and B. However, a subset of a frame may be punctured with these (or other) values of A and B and the remainder of the frame may be punctured by other known methods. For example, the first two bits of a frame may be punctured, and then the remainder of the frame may be punctured with the minimum distance between punctured bits as A or B; the total number of punctured bits should add up to P.

As described above, there are many different implementations of the high level method described above. According to one implementation, every D+1th bit is deleted in a frame until $P_{D+1}$ bits have been deleted. Then, every Dth bit is deleted until the entire frame has been processed. This method will be described in FIG. 2. A more uniform scheme involves alternating between deleting every D+1th bit and deleting every Dth bit until either $P_{D+1}$ bits separates by B have been deleted or $P_D$ bits separated by A have been deleted. Thereafter, if the former is true, every Dth bit is deleted, or, if the latter, every D+1th bit is deleted. This method will be described in FIG. 3. According to a third yet still more uniform method, to be described in FIG. 4, the following pattern of deletions is repeated: 1 symbol is deleted after skipping A symbols, N symbols separated by 3 symbols are then deleted, 1 symbol is deleted after skipping A symbols, and then O symbols separated by B symbols are then deleted, where N is the nearest integer less than $P_{D+1}$/PD and O is equal to N+1. For example, if A is 1, B is 2, N is 3 and O is 4, then the following bits are deleted 1, 3, 6, 9, 12, 14, 17, 20, 23, 26, 28 . . .

Still according to another method, the following pattern of deletions is repeated: N symbols separated by A symbols are deleted and O symbols separated by B symbols are deleted, where N:O is equal to $P_D$:$P_{D+1}$. Preferably, N and O are the smallest integers that effect the ratio N:O.

Figure 2:
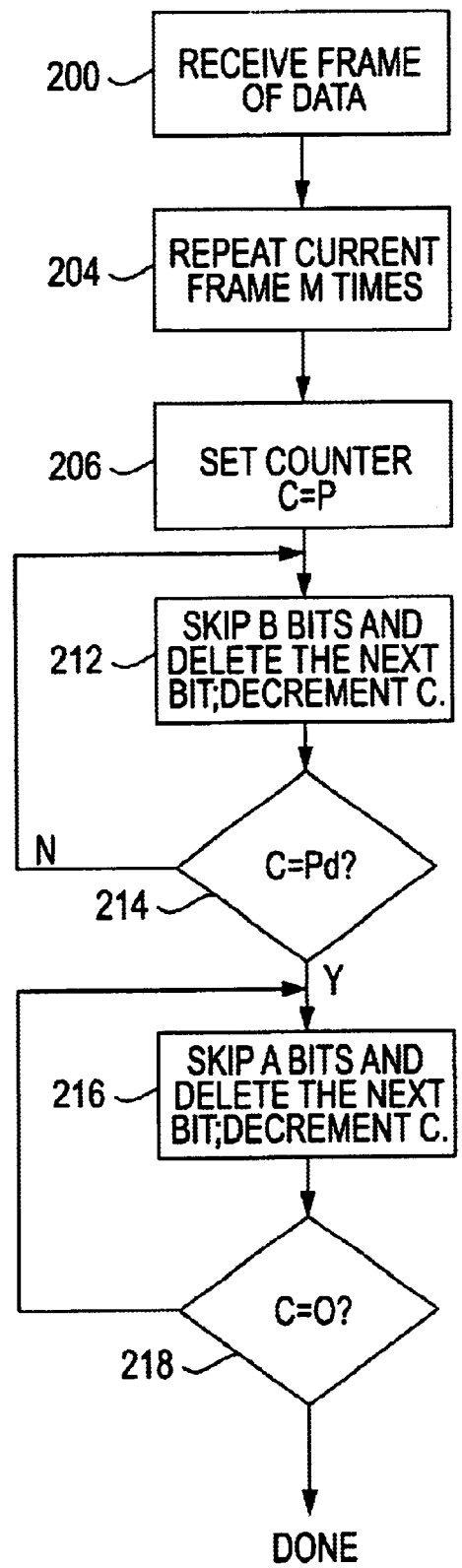
FIG. 2 is a flow chart of a first possible frame matching method according to the present invention.

FIG. 2 is a flow chart that describes the first of the above described implementations. In block 200, a frame of data is received by the matching circuit 147. The frame may be received in any combination of serial and parallel modes. The frame comprises a series of ordered bits, from the first bit to the Lth bit. In block 204, the matching circuit 147 repeats the current frame M times, thereby creating LM bits. In practice, the matching circuit 147 will preferably not store LM bits but will process incoming bits serially, repeating a frame only after first puncturing that frame. For ease of discussion, however, it is assumed that the matching circuit has access to LM bits.

In block 206, the matching circuit 147 sets a counter C equal to P. In block 212, the next B bits of the frame (in this case the first B bits of the frame) are skipped and the next bit is deleted; C is also decremented. In block 214, the matching circuit 147 checks whether C is equal to $P_D$. If not, control passes back to block 212. Otherwise, control passes to block 216, where the next A bits are skipped and the next bit deleted; C is decremented. Control passes to block 218, which checks whether C is 0. If not, control passes back to block 214. Otherwise, the matching circuit is finished.

Figure 3:
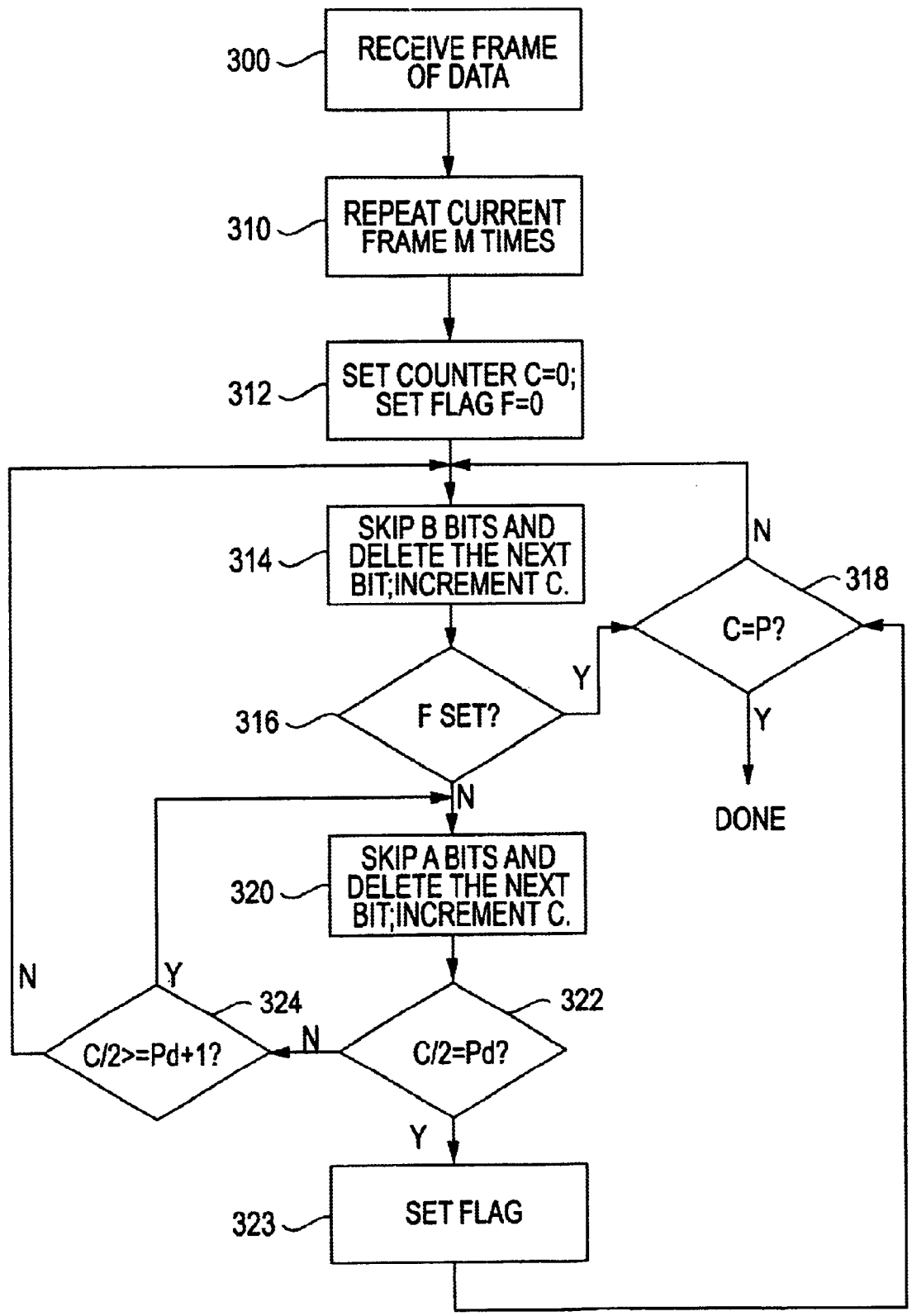
FIG. 3 is a flow chart of a second possible frame matching method according to the present invention.

FIG. 3 is a flow chart that describes the second of the above implementations. In block 300, a frame of data is received by the matching circuit 147. In block 310, the matching circuit 147 repeats the current frame M times, thereby creating LM bits. In block 312, the matching circuit 147 sets a counter C equal to equal to 0 and a flag F to 0. In block 314, the next B bits of the frame (in this case the first B bits of the frame) are skipped and the next bit is deleted; C is also incremented. In block 316, the matching circuit 147 checks whether the flag F has been set (i.e. is equal to 1). If the flag F has been set, control passes to block 318, which checks whether C is equal to P. If so, the routine exits. If not, control passes back to block 314. If the flag F has not been set, control passes to block 320, where the next A bits of the frame are skipped and the next bit is deleted; C is incremented. In block 322, the matching circuit 147 checks whether C/2 is equal to $P_D$. If so, the flag F is set in block 323 and control passes to block 318. If not, control passes to block 324, which checks whether C/2 is equal to or greater than $P_{D+1}$. If so, control passes back to block 320. Otherwise, control passes back to block 314.

Figure 4:
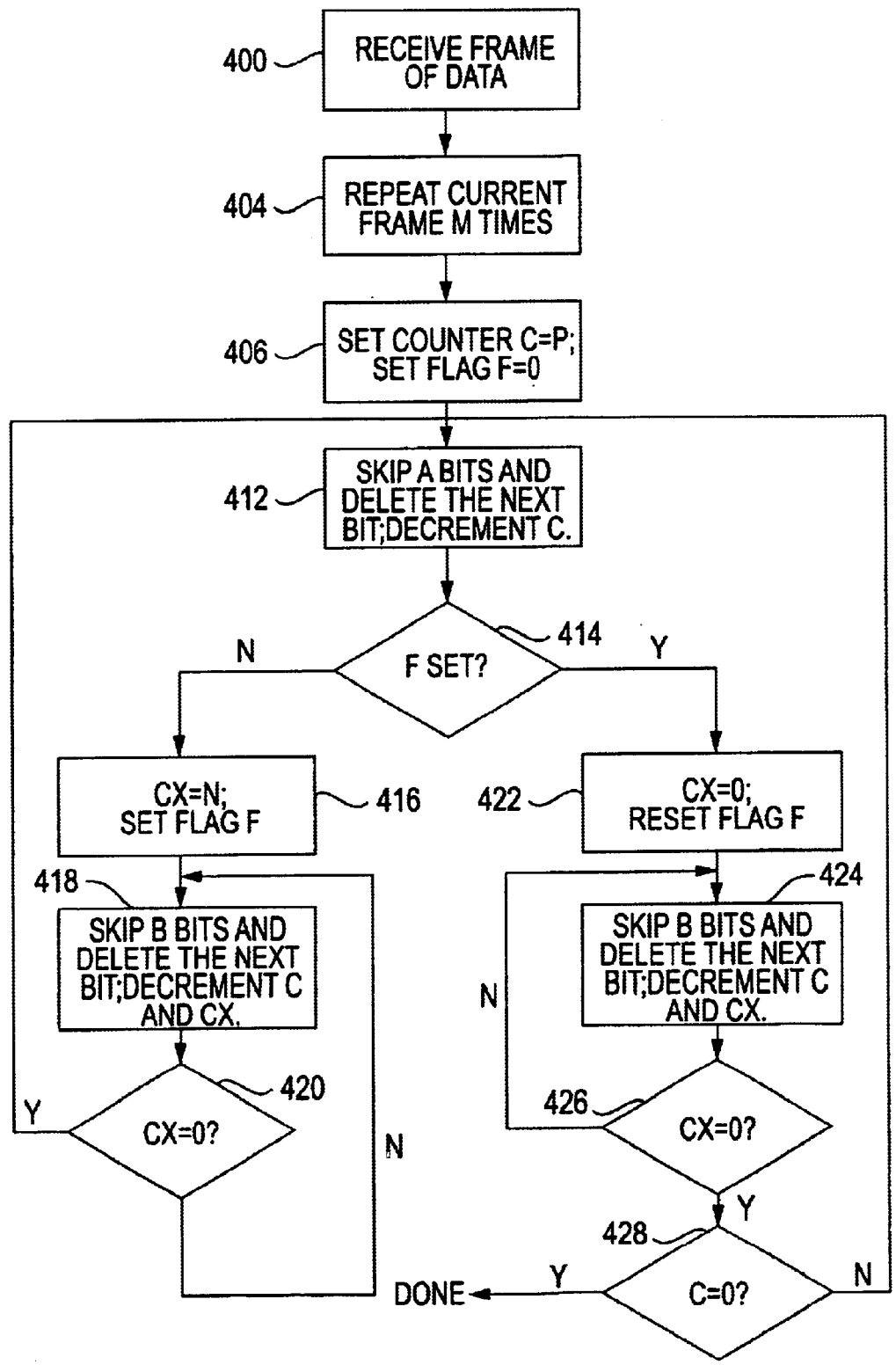
FIG. 4 is a flow chart of a second possible frame matching method according to the present invention.

FIG. 4 is a flow chart that describes the third of the above described implementations. In block 400, a frame of data is received by the matching circuit 147. The frame may be received in any combination of serial and parallel modes. The frame comprises a series of ordered bits, from the first bit to the Lth bit. In block 404, the matching circuit 147 repeats the current frame M times, thereby creating LM bits. In block 406, the matching circuit 147 sets a counter C equal to P and a flag F to 0. In block 412, the next A bits of the frame (in this case the first A bits of the frame) are skipped and the next bit is deleted; C is also decremented. In block 414, the matching circuit 147 checks whether F is set (equal to 1). If not, control passes to block 416, where a counter CX is set to N, where N is the nearest integer less than $P_{D+1}/P_D$. The Flag F is also set to 1. Control passes to block 418, the next B bits are skipped and the next bit deleted; C and CX are decremented Control passes to block 420, which determines whether CX is 0. If not, control passes back to block 418. If so, control passes back to block 412.

In block 414, if the Flag is set to 1, control passes to block 422, where a counter CX is set to O, where O=N+1. The Flag F is also set to 0. Control passes to block 424, the next B bits are skipped and the next bit deleted; C and CX are decremented. Control passes to block 426, which determines whether CX is 0. If not, control passes back to block 422. If so, control passes to block 428, which determines whether C is equal to 0. If so, the routine exits. Otherwise, control passes back to block 412.

The third implementation may also be implemented with the following C code, in which Pcnt is the count of the punctured symbols, Pidx(Pcnt) is the index into the unpunctured symbols of the Pcnt-th punctured symbol, for a given Pidx(0) (0<Pidx(0)<D−1) and Pcnt>0, and a counter Ratio-Cnt is initialized to 0. After the first symbol is punctured, the following steps are repeated until Pcnt>P−2;

```
Pcnt++;
Pidx(Pcnt) += D;
RatioCnt += P_{D+1};
If RatioCnt >= P,
    RatioCnt = RatioCnt−P
    Pidx(Pcnt)++
Endif
```

Conclusion

Numerous variations and modifications will become apparent to those skilled in the art once the about disclosure is fully appreciated. It is intended that the following claims be interpreted to embrace all such variations and modifications.

What is claimed is:

1. A method for decreasing the size of a frame of digital data from a first number of bits to a second number of bits, the method comprising:
   (a) Receiving a frame having LM bits ordered from a first bit to an LMth bit; and
   (b) Deleting LM−N bits from the frame in a single iteration through the data, thereby creating a reduced length frame of length N for processing in a digital communications system, wherein the deleting step is performed such that the distance between any two consecutive deleted bits within any group within a first subset of the frame is A bits, and the distance between any two consecutive deleted bits within any group within a second subset of the frame is B bits, where A is an integer greater than 0 and B is an integer greater than A, and where the first subset and the second subset together form a first plurality of consecutive bits.

2. The method of claim 1 wherein the frame consists of the first subset and the second subset.

3. The method of claim 1 wherein B=A+1.

4. The method of claim 1 wherein A is equal to D−1, where D is the greatest integer less than LM/P, where P=LM−N.

5. The method of claim 1 wherein the first subset consists of the first X bit of the frame, where X is the number of bits in the first subset.

6. The method of claim 1 wherein the distance between consecutive deleted bits alternates between A and B throughout at least a portion of the frame.

7. The method of claim 1 wherein a second plurality of bits consists of a first plurality of groups, each with a third number of bits, and a second plurality of groups, each with a fourth number of bits, wherein each group consists of a plurality of bits deleted in order, wherein the first and second plurality of bits are deleted according to a repeating sequence, the sequence consisting of all bits within one of the first plurality of groups, one of the first plurality of bits, and all bits within one of the second plurality of groups.

8. The method of claim 7 wherein:
   the third number of bits is equal to a lower bound of a first real number, where the first real number is equal to the number of bits within the second plurality of bits divided by the number of bits within the first plurality of bits; and
   the fourth number of bits is equal to the third number of bits plus 1.

9. The method of claim 1, further comprising interleaving the reduced length frame.

10. A method of deriving an N-length frame having a number N of digital bits from a received frame having a number LM larger than N of digital bits, the method comprising:
   (a) receiving a frame having LM bits in a contiguous sequence indexed from one to LM;
   (b) selecting puncturing bits (PBs), each PB separated from a PB of next lowest index, if any, by an associated distance of d nonpuncturing bits (NPBs), such that distances d associated with a first plurality of PBs are each equal to a non-zero integer A of NPBs, and distances d associated a second plurality of PBs are each equal to a different non-zero integer B of NPBs; and
   (c) removing P selected PBs in a single iteration through the bits of the received frame, where P=LM−N), to produce a punctured frame consisting of N bits.

11. The method of claim 10, wherein substantially all distances d are equal to A or to B.

12. The method of claim 10, wherein each distance d between selected PBs in a first contiguous subset of the received frame sequence of bits is A NPBs, and each distance d between selected PBs in a second contiguous subset of the received frame sequence of bits is B NPBs.

13. The method of claim 10, wherein d for selected PBs of progressively higher index alternate between A and B NPBs.

14. The method of claim 10, wherein $A=B-1$.

15. The method of claim 14, wherein B is a greatest integer less than LM/P, $N_{dB}=(LM-P*B)$, $N_{dA}=P-N_{dB}$, and step (b) includes selecting $N_{dA}$ PBs for which $d=A$, and $N_{dB}$ PBs for which $d=B$.

16. The method of claim 15, wherein step (b) includes selecting $N_{dA}$ PBs for which $d=A$ from a contiguous subset of the received frame.

17. The method of claim 16, wherein, for selected PBs of monotonically increasing index, distances d alternate between values A and B.

18. The method of claim 17, wherein, for the selected PBs of monotonically increasing index, distances d alternate in a predetermined periodic pattern between values A and B.

* * * * *